United States Patent [19]

Dorler et al.

[11] 4,417,159
[45] Nov. 22, 1983

[54] DIODE-TRANSISTOR ACTIVE PULL UP DRIVER

[75] Inventors: Jack A. Dorler, Wappinger Falls; Joseph M. Mosley, Hopewell Junction; Richard O. Seeger, Wappinger Falls; Stephen D. Weitzel, Poughkeepsie, all of N.Y.

[73] Assignee: International Business Machines Corporation, Armonk, N.Y.

[21] Appl. No.: 293,830

[22] Filed: Aug. 18, 1981

[51] Int. Cl.³ .............................................. H03K 5/00
[52] U.S. Cl. ..................................... 307/270; 307/264
[58] Field of Search ............... 307/270, 264, 241, 246, 307/268, 292

[56] References Cited

U.S. PATENT DOCUMENTS

| | | | |
|---|---|---|---|
| 3,171,984 | 3/1965 | Eshelman et al. | 307/457 |
| 3,495,100 | 2/1970 | Cubert et al. | 307/270 |
| 3,636,383 | 1/1972 | Clubbe | 307/292 |
| 3,656,004 | 4/1972 | Kemerer et al. | 307/246 |
| 3,657,574 | 4/1972 | Christensen et al. | 307/302 |
| 3,684,900 | 8/1972 | Greuter et al. | 307/292 |
| 4,019,152 | 4/1977 | Harwood et al. | 330/29 |
| 4,061,933 | 12/1977 | Schroeder et al. | 307/262 |
| 4,081,699 | 3/1978 | Hirt et al. | 307/246 |
| 4,091,296 | 5/1978 | Suzuki et al. | |
| 4,176,289 | 11/1979 | Leach et al. | 307/270 |

*Primary Examiner*—John S. Heyman
*Assistant Examiner*—Timothy P. Callahan
*Attorney, Agent, or Firm*—Mitchell S. Bigel

[57] ABSTRACT

A driver circuit for a capacitively loaded line employs the charge storage capacitance of a diode for raising the base of a driver transistor above the circuit power supply voltage level so as to pull up the line to within a transistor base-emitter voltage drop of the power supply voltage level. The driver is easily fabricated in integrated circuit form, as no capacitors, either on or off chip, are required.

The driver circuit includes a driver transistor, the collector of which is connected to the power supply and the emitter of which is connected to the line. A switching transistor has an input voltage applied between its base and emitter. A diode is connected between the switching and driver transistors, the anode being connected to the base of the driver transistor, and the cathode being connected to the collector of the switching transistor.

In response to a first input signal, the switching transistor turns on, forward biasing the diode and building up a voltage thereon as a result of the diode's charge storage capacitance. In response to a second input signal, the switching transistor turns off, raising the anode to the power supply voltage, and raising the cathode (and the base of the driver transistor connected thereto) to a voltage higher than the power supply voltage. The emitter of the driver transistor (and the line connected thereto) is thus pulled up to a value nominally approaching the power supply voltage, despite the base-emitter voltage drop of the driver transistor.

17 Claims, 5 Drawing Figures

DIODE-TRANSISTOR ACTIVE PULL UP DRIVER

TECHNICAL FIELD

This invention relates generally to a driver circuit for a capacitively loaded line, and more particularly, to a driver circuit for rapidly pulling up a capacitively loaded line, to within a transistor base-emitter voltage drop of the driver circuit power supply voltage.

Many contemporary data processing systems include arrays of cells, e.g., memory or logic arrays. In such arrays, a given row or column may be accessed by pulling up a line, connected to each cell in the given row or column, to a predetermined voltage, nominally approaching the system power supply voltage (commonly referred to as $V_{CC}$). Typically, there may be a few hundred cells connected to a given line, each of which presents a capacitive load thereto.

As a consequence of this heavy capacitive load, a typical line driver will not be able to pull up the line to the required voltage without appreciable time delay, since the time it takes to pull up a line is proportional to the capacitance thereof. This appreciable delay can have an adverse affect on the overall speed of the array. For example, if the array is a digital memory, the memory access speed will depend upon the speed in which the line driver can pull up a given row or column. By excessively slowing down access time, overall memory speed is decreased thereby creating a decrease in speed of the digital system of which the memory is a part. Such speed degradation cannot be tolerated in modern day applications.

Similarly, other contemporary electronic systems may require a heavily capacitive line to be rapidly pulled up to within a nominal value of the system power supply voltage. The inability of a line driver to rapidly pull up the line results in unacceptable speed degradation of the entire system.

BACKGROUND ART

Many circuits have been devised for driving a heavily capacitive line to a value approaching the system power supply voltage, $V_{CC}$. However, all the circuits heretofore devised possessed various shortcomings described below.

The simplest driver circuit for pulling up a capacitively loaded line to a value approaching $V_{cc}$ is a simple resistor pull up, i.e., a resistor connected between $V_{cc}$ and the capacitively loaded line. In order to rapidly pull-up the line, the value of the resistor must be kept small (so as to achieve a small RC time constant). However, if the value of the resistor is kept small, the power dissipated in the resistor when the line is held at a low voltage level (whereupon a large current flows through the resistor), is considerable. Of course, a larger value of the resistor would lessen power dissipation, but at the expense of pull-up speed (higher RC time constant).

A more sophisticated driver circuit for driving a capacitively loaded line is a transistor pull up, wherein a transistor is connected between $V_{CC}$ and the capacitively loaded line, for example, by connecting the collector of the transistor to $V_{CC}$ and the emitter to the capacitively loaded line. A biasing resistor is connected between $V_{CC}$ and the base of the transistor. The transistor, acting as a low impedance source, rapidly pulls up the line. However, since there is always a voltage drop between the base and emitter of a transistor (commonly referred to as $V_{BE}$), the transistor driver can only pull up the line to a voltage value of one $V_{BE}$ drop below $V_{CC}$.

The prior art has proposed two modifications of the transistor pull up for pulling up the line the remaining $V_{BE}$; however, neither solution is entirely acceptable. The first solution is to use a driver circuit power supply voltage higher than the system power supply voltage. The capacitively loaded line may then be driven to a value approaching the system power supply voltage despite the transistor base-emitter voltage drop because the transistor is driven by a higher voltage power supply. This solution is not acceptable because of the added complexity and expense of maintaining two separate power supplies in a given system. A second modification is to add a resistor between $V_{CC}$ and the line, for pulling up the line the remaining $V_{BE}$ voltage. Such a modification is also unacceptable because the use of a resistor involves the same speed-power trade off involved in the simple resistor pull up discussed above. Briefly, if the resistor is large, pull up time is long, while if the resistor is small, power dissipation is excessive.

Another prior art solution for pulling up a capacitively loaded line to a value approaching $V_{CC}$ is capacitor pull up. In capacitor pull up, a transistor is used to actively drive the line by connecting the collector thereof to $V_{CC}$ and the emitter thereof to the line. The base of the transistor is connected to the first end of a capacitor. The base of the transistor is also connected to $V_{CC}$ through a biasing resistor, so as to permit current to flow into the capacitor. In order to pull up the line, the other end of the capacitor is pulsed, so as to charge up the capacitor by means of an AC current flowing through the biasing resistor and into the capacitor. Then, the pulsed end of the charged capacitor is raised to $V_{CC}$. The base of the transistor thus rises above $V_{CC}$ because of the voltage built up on the charged capacitor, so that the emitter is maintained at or about $V_{CC}$, despite the transistor base-emitter voltage drop. The line is thus pulled up to a value nominally approaching $V_{CC}$.

Unfortunately, capacitive pull up is not acceptable for use in high density integrated circuit construction, since each driver requires either an external capacitor, or an "on-chip" capacitor. An external capacitor takes up an excessive amount of space, and requires an individual connection to the driver circuit. An "on-chip" capacitor requires an excessive amount of chip area. Since the line driver may be employed in a digital system having a large number (e.g., several hundred) of line drivers, the use of capacitor pull up requires a bank of several hundred external capacitors or several hundred "on-chip" capacitors. Clearly neither solution is acceptable as the space required by such large numbers of capacitors, either on or off chip, is inconsistent with the high density requirements of modern digital systems.

Moreover, capacitive pull up requires additional circuitry for limiting the voltage built up on the capacitor, so that the first end of the capacitor (and the base of the transistor connected thereto), does not drift all the way up to $V_{CC}$ when the other end of the capacitor is not pulsed. If the base of the transistor drifts up to $V_{CC}$ then the transistor will turn on and the line will be driven at improper times. Circuitry must be incorporated to limit the charging of the capacitor so that the base of the transistor doesn't rise to $V_{CC}$ when the other end of the capacitor is not pulsed. The requirement for such limiting circuitry adds to the complexity of the driver and requires an excessive amount of area when hundreds of such limiting circuits must be incorporated on or off chip. As a consequence of the above limitations, capacitive pull up has not been used in integrated circuit technology.

DISCLOSURE OF INVENTION

It is object of the invention to provide an improved driver for a capacitively loaded line.

It is another object of the invention to provide a driver for rapidly pulling up a capacitively loaded line to a voltage, the value of which differs from the supply voltage by less than a transistor base-emitter voltage drop.

It is still another object of the invention to provide a driver circuit for a capacitively loaded line which is easily fabricated in integrated circuit form without the requirement for external capacitors, large "on-chip" capacitors or additional charge limiting circuits.

It is yet another object of the invention to provide a driver circuit for a capacitively loaded line which consumes a minimal amount of power.

These and other objects are accomplished by a driver circuit for a capacitively loaded line including a driver transistor, the collector of which is connected to the supply voltage, $V_{CC}$, and the emitter of which is connected to the capacitively loaded line. The anode side of a diode is connected to the base of the driver transistor. A pair of biasing resistors connects $V_{CC}$ with the cathode and anode of the diode, respectively. A switching transistor is connected to the cathode side of the diode, and is responsive to an input signal (which may be derived from the output of other digital circuits, e.g., clock circuits or logic gates). Finally, a holding resistor couples $V_{CC}$ with the emitter of the first transistor.

Operation of the driver of the present invention is as follows: In response to a first input signal, the switching transistor turns on, pulling the cathode of the diode down and forward biasing the diode. The forward biased diode builds up an anode-cathode capacitance as a function of its forward current. The value of the capacitive voltage is a function of the forward bias current of the diode. This forward bias current is limited by the diode junction properties and by the biasing resistors, thus precluding the base of the driver transistor from drifting to $V_{CC}$ without the use of external limiting circuits.

In response to a second input signal, the switching transistor turns off, cutting off the diode current. The cathode of the diode rises to $V_{CC}$ since it is connected to $V_{CC}$ via a small biasing resistor. The voltage at the anode thus rises to a value greater than $V_{CC}$ by an amount that transiently approaches the forward diode voltage. Since the anode is connected to the base of the driver transistor, the base of the driver transistor likewise rises to a voltage level greater than $V_{CC}$ (by an amount that transiently approaches the forward diode voltage). Finally, the voltage at the emitter of the driver transistor is equal to the base voltage less a base-emitter drop. The emitter, and the capacitively loaded line connected thereto are thus pulled up to a voltage approaching $V_{CC}$ because the base of the driver transistor was pulled above $V_{CC}$. As the diode capacitance discharges, the base of the switching transistor falls toward $V_{CC}$, however, the line is maintained at its pulled up level by the holding resistor.

Since the base of the driver transistor is raised above $V_{CC}$, the driver transistor can drive the capacitively loaded line to a value approaching $V_{CC}$ despite the driver transistor's base-emitter voltage drop, $V_{BE}$. This may be accomplished without the use of a second higher voltage power supply, as the higher voltage necessary to rapidly pull up the capacitive load is provided by the charge accumulated on the diode capacitance. Moreover, since the holding resistor merely provides a small standby current to maintain the line at its raised level, it may be a large valued resistor which dissipates less power. This contrasts with the prior art resistor or transistor pull up described above, wherein the resistor had to be small so as to rapidly pull up the capacitively loaded line. Finally, since the driver circuit of the invention does not require the use of large capacitor banks (either on or off chip), or charge limiting circuits, it may be easily fabricated in integrated circuit form, thus making it eminently suitable for use in a high density, high speed digital system.

BEST MODE FOR CARRYING OUT THE INVENTION

Figure 1:
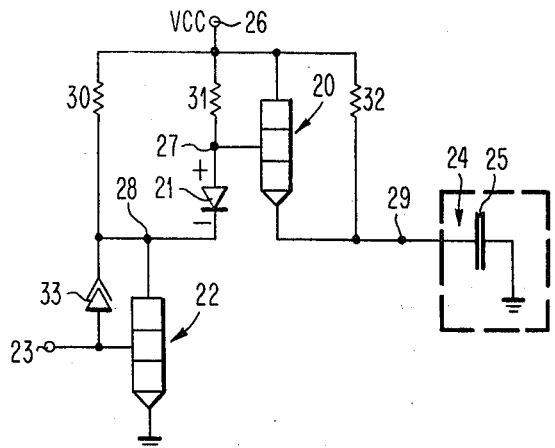
FIG. 1 is a circuit diagram of the driver circuit of the invention.

Referring now to FIG. 1, a circuit diagram of the driver circuit of the present invention is illustrated. The driver circuit includes a driver transistor 20, the collector of which is connected to the system power supply voltage $V_{CC}$ at node 26, and the emitter of which is connected, at node 29, to a capacitively loaded line 24 represented schematically by capacitor 25. The base of driver transistor 20 is connected to the anode of diode 21 at node 27. Diode 21 is preferably the base-collector junction of a transistor, which provides appreciable capacitance as a function of forward current flow. It will be understood by those having skill in the art that as a result of limitations present in semiconductor manufacturing techniques, the forward diode voltage rise may be attenuated by stray capacitance and/or parasitic transistor action.

The collector of a switching transistor, 22, is connected to the cathode of diode 21 at node 28. The emitter of switching transistor 22 is grounded while the base of switching transistor 22 is connected to an input signal source at node 23. The input signal source may be the output of another digital circuit as will be explained with regard to the embodiments of FIGS. 2 and 3. Schottky diode 33 supplies saturation protection for transistor 22. To complete the circuit, first biasing resistor 30 is connected between power supply node 26 and the cathode of diode 21 at node 28. Second biasing resistor 31 is connected between node 26 and the anode of diode 21 at node 27. Finally, holding resistor 32 is connected between power supply node 26 and the emitter of driver transistor 20.

Operation of the circuit of FIG. 1 will now be described. Initially, the input signal at node 23 is sufficiently high so as to turn on switching transistor 22. Current flows through switching transistor 22 thus pulling node 28 low (to a value equal to the collector-emitter voltage of switching transistor 22). Current flows through first biasing resistor 30 into transistor 22, and through second biasing resistor 31, into diode 21, into transistor 22. Diode 21 is forward biased. Driver transistor 20 is near cut off because the load current is now supplied through holding resistor 32.

As is well known to those having skill in the semiconductor art, a diode has two types of capacitance associated therewith. The first capacitance is generally referred to as depletion capacitance and is due to the charge depletion at the PN diode junction. The depletion capacitance is dominent under reverse bias conditions. The second capacitance is referred to as the diffusion or charge storage capacitance which arises from the lagging behind of voltage as current changes, due to charge storage effects. The diffusion or charge storage capacitance is dominent under forward bias conditions, and is an exponential function of the current through the junction.

Since diode 21 is forward biased, the diffusion or charge storage capacitance dominates. Diode 21 is preferably a base-collector junction of a transistor so as to maximize the value of this diffusion capacitance. The charge stored in diode 21 builds up while the diode remains forward biased so that a voltage appears across the diode 21. The direction of the voltage is given by the "plus" and "minus" signs across diode 21 in FIG. 1. The value of this voltage depends upon the diode current and the particular PN junction parameters, and may be chosen to limit the size of this voltage as desired. By utilizing the capacitive properties of a diode rather than an actual capacitor, voltage build up is limited by the DC forward bias current flowing therethrough. Thus, it may be ensured that node 27 will not drift up towards $V_{CC}$ and prematurely turn on transistor 20, without requiring limiting circuits as would be the case had an actual capacitor been used.

In order to pull up capacitively loaded line 24, the input signal at node 23 is lowered, thus turning off switching transistor 22. With transistor 22 off, no current flows through diode 21. Current now flows through resistor 30, pulling node 28 to $V_{CC}$. The speed of node 28 rising to $V_{CC}$ is regulated by the value of resistor 30.

As is well known to those having skill in the art, the voltage across a capacitor cannot instantaneously change. Thus, even when the current through diode 21 is cut off, the voltage thereon, due to the diode capacitance, will decay slowly. Since node 28 is pulled up to $V_{CC}$, node 27 is pulled up to a voltage greater than $V_{CC}$, by the amount of the capacitive voltage across diode 21. Driver transistor 20 heavily turns on, supplying a large current to node 29 and into the capacitively loaded line, charging the line towards $V_{CC}$. The final voltage at node 29 is given by the voltage at node 27 less the base-emitter voltage drop ($V_{BE}$) of transistor 20. Since node 27 was raised above $V_{CC}$ by virtue of the voltage stored on diode 21, the voltage at node 29 will be approximately $V_{CC}$ despite the base-emitter voltage drop of driver transistor 20.

As the capacitance of diode 21 discharges, node 27 drops to below $V_{CC}$ and driver transistor 20 turns off. Node 29 is maintained at its pulled up level by holding resistor 32. The value of holding resistor 32 may be large as it only need supply a small standby current to maintain the line at its pulled up level. Power dissipation through the holding resistor may thus be minimized. Power dissipation through the driver transistor is also minimized, as it only supplies a large current during the short time interval when the diode capacitance is discharging.

Figure 4:
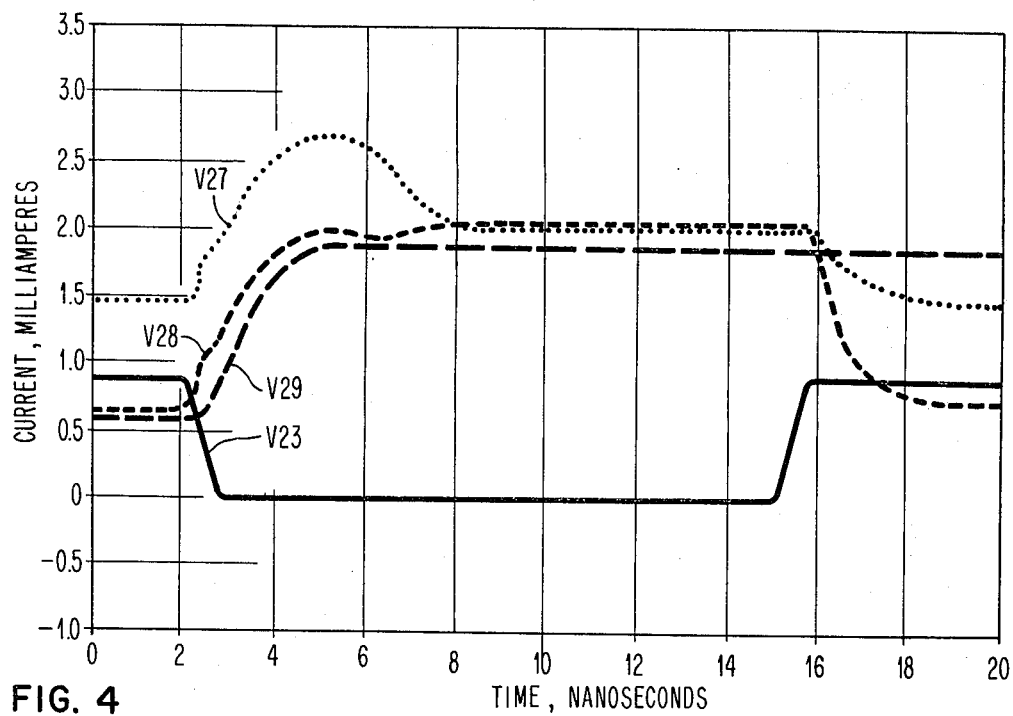
FIG. 4 is a waveform plot of various voltages in the driver of FIG. 1.
Figure 5:
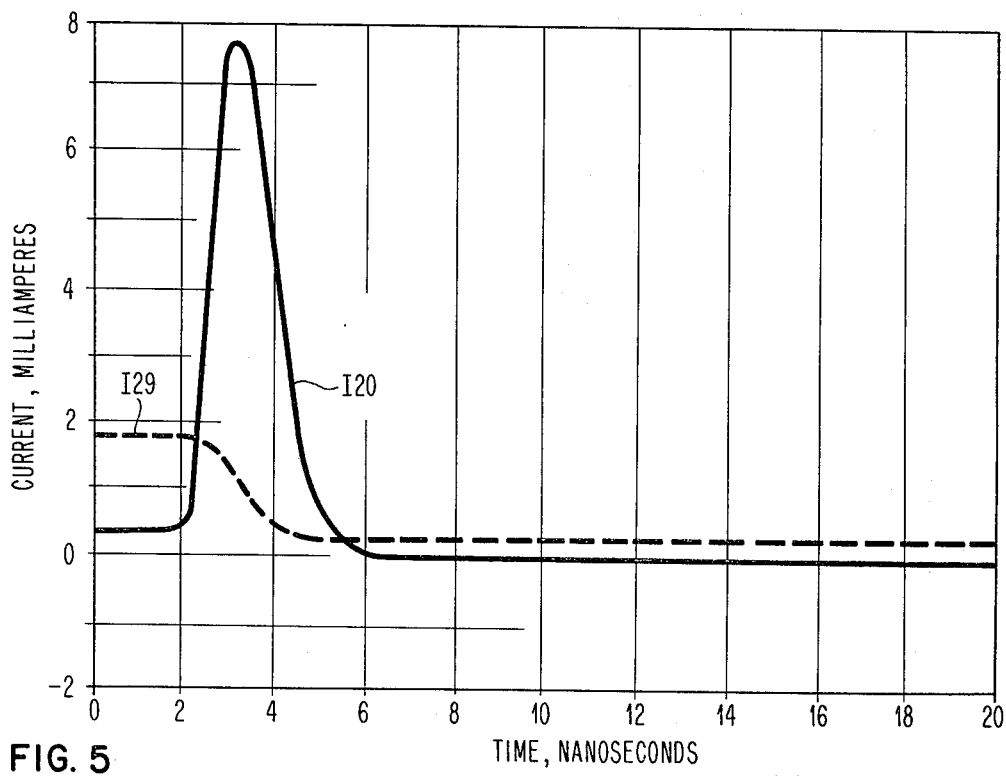
FIG. 5 is a waveform plot of various currents in the driver of FIG. 1.

Referring now to FIGS. 4 and 5, there are shown a group of waveform plots of various voltages and currents, respectively, in the driver of FIG. 1. The component values employed for generating these waveforms are as follows:

| Power supply voltage, $V_{CC}$ (node 26) | 2.0V |
|---|---|
| First biasing resistor 30 | 1.2K |
| Second biasing resistor 31 | 3.0K |
| Holding resistor 32 | 1.0K |

It will be understood that the above component values are merely illustrative, and that other values may be used, depending upon the requirements of the system in which the present driver is employed.

FIG. 4 illustrates four voltage waveforms in the circuit of FIG. 1 having the parameters listed above. The driver input voltage (at node 23) is denoted by $V_{23}$. The diode cathode voltage (at node 28) is denoted by $V_{28}$, while the diode anode voltage (at node 27) is denoted by $V_{27}$. Finally, the line voltage (at node 29) is denoted by $V_{29}$. Similarly, two current waveforms in the circuit of FIG. 1 having the parameters listed above are illustrated in FIG. 5. The collector (or emitter) current of driver transistor 20 is denoted by $I_{20}$, while the total current flowing through node 29 into the capacitively loaded line is denoted by $I_{29}$.

Referring now to FIG. 4, the input signal $V_{23}$ is initially maintained high (here approximately at 0.8 V), for approximately 2 nanoseconds (ns). With $V_{23}$ high, $V_{28}$ is low, at a value given by the collector-emitter voltage of switching transistor 22 (approximately 0.6 V). the voltage differential between node 27 and 28 is determined by the junction voltage of diode 21. In FIG. 4, the voltage differential is seen to be approximately 1.4 V−0.6 V or 0.8 V. Node 29 is maintained low, by means of current drawn therethrough by capacitively loaded line 24 or by a separate load device (not shown).

At about 2 ns the input signal at node 23 is decreased to 0.0 V, thus turning off switching transistor 22. As will be seen from FIG. 4, the voltage at node 28 rapidly rises to 2.0 V ($V_{CC}$), while the voltage at node 27 rises to about 2.7 V as the voltage difference across diode 21 is maintained. Driver transistor 20 turns on and a large current builds up therein (see FIG. 5) to drive the line positive. The voltage at node 29 rises to a value very close to $V_{CC}$; e.g., in FIG. 4, to about 1.8 V. This 0.2 V difference from $V_{CC}$ is much less than the $V_{BE}$ of driver transistor 20 which is seen to be about 0.9 V. The current in transistor 20 rapidly builds up to a value approaching 8 ma, thus rapidly charging the capacitively loaded line 24. The current in transistor 20 then falls to zero as the diode capacitance voltage is discharged in both diode 21 and transistor 20, resulting in node 27 dropping below $V_{CC}$. The standby current through node 29 is thereafter supplied solely by holding resistor 32 and remains at a low value, while the voltage at node 29 remains at about 1.8 V.

The above steady state parameters exist as long as the input signal $V_{23}$ remains low. When it is no longer desired to hold the capacitively loaded line positive, the input signal voltage $V_{23}$ is raised thus turning on switching transistor 22. This occurs in FIG. 4 at about 16 ns. When switching transistor 22 turns on it will be seen that the voltage at node 28 drops from $V_{CC}$ down to the collector-emitter voltage of switching transistor 22, while the voltage at node 27 drops from $V_{CC}$ to about 1.5 V as diode 21 conducts. The voltage differential between nodes 27 and 28 at 20 ns is given by the diode voltage and is seen to be about 0.8 V.

Referring again to FIG. 4, it will be seen that the voltage at node 29 does not drop after 16 ns. The capacitively loaded line may be pulled down by the addition of an active pull down transistor to the circuit of FIG. 1. The addition of an active pull down transistor is illustrated in FIG. 2 and will be described below.

Figure 2:
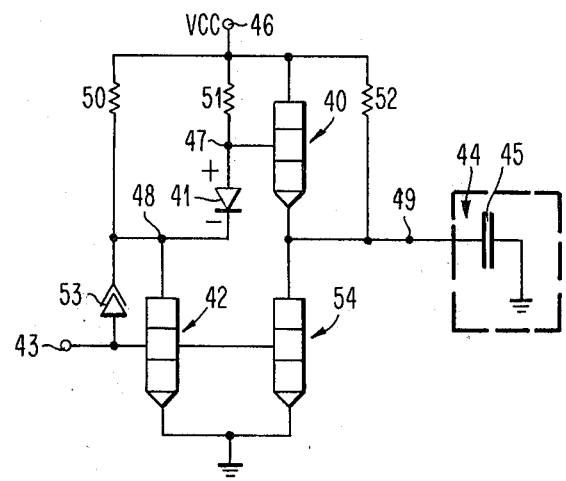
FIG. 2 is a circuit diagram of the driver circuit of the invention, employing an active pull down.

Referring now to FIG. 2 it will be seen that the circuit illustrated therein is identical to the circuit of FIG. 1 except for the addition of pull-down transistor 54. As in the circuit of FIG. 1, a driver transistor 40 has its collector connected to $V_{CC}$ at node 46, and its emitter connected (at node 49), to capacitively loaded line 44, represented by capacitor 45. The anode of diode 41 is connected to the base of driver transistor 40 at node 47 while the cathode of diode 41 is connected to the collector of switching transistor 42 at node 48. The base of switching transistor 42 is connected to an input signal at 43. Input Schottky diode 53 provides surge protection. Biasing resistors 50 and 51 are connected between $V_{CC}$ and node 48 and 47, respectively, while holding resistor 52 is connected between $V_{CC}$ and node 49.

The circuit of FIG. 2 also includes pull down transistor 54. The base of pull down transistor 54 is connected to the base of switching transistor 42 while the collector of pull down transistor 54 is connected to the emitter of driver transistor 40, and the emitter of pull down transistor 54 is grounded. It will thus be seen that the combination of driver transistor 40 and pull down transistor 54 forms a push-pull driver pair which can actively pull node 49 up or down. It will further be seen that either of transistors 40 or 54 (but not both), will be on at a given time. Thus, when transistor 40 is on and pulling up the capacitively loaded line transistor 54 will be off and the operation of the driver of FIG. 2 will be as described with regard to FIG. 1. However, when the input signal at node 43 (denoted by $V_{23}$ in FIG. 4) is raised, transistor 54 will turn on thus rapidly pulling down the voltage at node 49. The action of pull down transistor 54 serves to rapidly pull down the line voltage ($V_{29}$ in FIG. 4) in response to the turning on of switching transistor 42 (at 16 ns in FIG. 4). Pull down speed as well as pull up speed is thus maximized.

The line driver of the present invention may be employed whenever a driver is required to drive a heavily capacitively loaded line. For example, in a digital system employing a clock, the output of which is connected to many points in the system, the circuit of FIG. 1 or 2 may be used as part of a clock driver by connecting the clock output to nodes 23, or 43, respectively. Similarly, by applying the output of any digital circuit to input nodes 23 or 43 of FIGS. 1 or 2, respectively, the digital circuit output voltage may be employed for rapidly driving a capacitively coupled line. One such application is illustrated in FIG. 3 wherein the driver circuit of the present invention is coupled to the output of a TTL logic gate.

Figure 3:
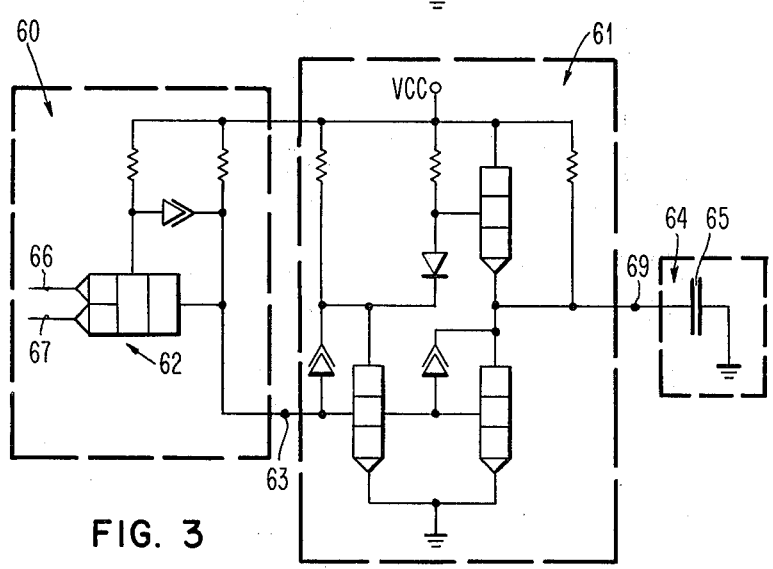
FIG. 3 is a circuit diagram of an improved logic driver employing the invention.

Referring now to FIG. 3 it will be apparent that the circuit inside box 61 is identical with the active pull up driver of the present invention as illustrated in FIG. 2. It will also be apparent that the circuit inside box 60 is a conventional input of a TTL logic gate including compound transistor 62 having TTL inputs 66 and 67. TTL gate 60 is coupled to driver 61 at input node 63. Operation of the TTL gate will not be described further as it is merely shown to illustrate how the driver circuit of the present invention may be coupled with any digital circuit to enable the digital circuit to drive a capacitively loaded line. It will thus be understood by those having skill in the art that the input node of the driver circuit of the present invention (node 23 of FIG. 1 or node 43 of FIG. 2) may be coupled to a digital signal generated by any digital circuit and employed to rapidly drive a capacitively coupled line.

From the above description it will be seen that the driver circuit of the present invention incorporates many heretofore unavailable features:

1. The driver circuit is high speed. Referring to FIG. 4, for example, it is seen that the highly capacitive line is driven from its low value of 0.6 V to its high value of 1.8 V in approximately 2 ns.

2. The line is pulled up to within sub-$V_{BE}$ values of $V_{CC}$ without the use of dual power supplies. Referring for example, to FIG. 4, the highly capacitive line is pulled up to about 1.8 V (with $V_{CC}$ being 2.0 V). In the absence of the invention, the line could only be actively pulled up to about 1.2 V because of the 0.8 V base emitter drop of the driver transistor.

3. The driver of the present invention dissipates a minimal amount of power as the driver transistor is on for only a brief period of time when supplying the current spike shown in FIG. 5. The holding resistor merely supplies a small steady state current for maintaining the line in its pulled up state, thus dissipating minimal power.

4. A large number of drivers of the present invention may be used repeatedly on an integrated circuit chip without requiring a bank of external or on-chip capacitors and the consequent circuits for limiting charge build-up on the capacitors.

5. The input node of the driver circuit of the present invention may be coupled with standard digital circuits as illustrated in FIG. 3, so that the output of any digital circuit may be employed to rapidly pull up a capacitively loaded line.

Whereas we have illustrated and described the various embodiments of our invention it is to be understood that we do not limit ourselves to the precise construction herein disclosed and the right is reserved to all changes and modifications coming within the scope of the invention as defined in the appended claims.

We claim:

1. A driver for rapidly pulling up a capacitive load, comprising:

a driver transistor having a base, an emitter and a collector, the collector of which is connected to a predetermined voltage and the emitter of which is connected to said capacitive load, a diode having an anode and a cathode, the anode of which is connected to the base of said driver transistor, forward bias current providing means connected to said anode, for providing forward bias current through said diode when a forward bias voltage is applied thereto, and means for developing a forward diode voltage between said anode and said cathode to thereby cause forward bias current to flow through said diode from said forward bias current providing means and build up a diode diffusion capacitance between said anode and said cathode, and for connecting said predetermined voltage to said cathode, to thereby raise the base of said driver transistor above said predetermined voltage by an amount equal to said forward diode voltage, whereby the emitter of said driver transistor, and said capacitive load connected thereto, are pulled up to a voltage, which differs from said predetermined voltage by less than the base-emitter voltage drop of said driver transistor.

2. A driver for rapidly pulling up a capacitive load, comprising:

a driver transistor having a base, an emitter and a collector, the collector of which is connected to a predetermined voltage and the emitter of which is connected to said capacitive load, a diode having an anode and a cathode, the anode of which is connected to the base of said driver transistor, forward bias current providing means connected to said anode, for providing forward bias current through said diode when a forward bias voltage is applied thereto, and means responsive to a first input signal for developing a forward diode voltage between said anode and said cathode to thereby cause forward bias current to flow through said diode from said forward bias current providing means, and build up a diode diffusion capacitance between said anode and said cathode, and responsive to a second input signal, for applying said predetermined voltage to said cathode, to thereby raise the base of said driver transistor above said predetermined voltage by an amount equal to said forward diode voltage, whereby the emitter of said driver transistor, and said capacitive load connected thereto, are pulled up to a voltage, which differs from said predetermined voltage by less than the base-emitter voltage drop of said driver transistor.

3. A driver for rapidly pulling up a capacitive load, comprising:

a driver transistor having a base, an emitter and a collector, the collector of which is connected to a predetermined voltage and the emitter of which is connected to said capacitive load, a diode having an anode and a cathode, the anode of which is connected to the base of said driver transistor, forward bias current providing means connected to said anode, for providing forward bias current through said diode when a forward bias voltage is applied thereto, a first biasing resistor connected between said predetermined voltage and said cathode, and a switching transistor having a base, an emitter and a collector, the collector of which is connected to said cathode, for turning on in response to a first input signal, to thereby develop a forward diode voltage between said anode and said cathode, and cause forward bias current to flow through said diode from said forward bias current providing means and build up a diode diffusion capacitance between said anode and said cathode, and for cutting off in response to a second input signal, to thereby raise said cathode to said predetermined voltage, by virtue of the connection of said first biasing resistor, whereby the base of said driver transistor is raised above said predetermined voltage by an amount equal to said forward diode voltage, and the emitter of said driver transistor and said capacitive load connected thereto are pulled up to a voltage, which differs from said predetermined voltage by less than the base-emitter voltage drop of said driver transistor.

4. A driver for rapidly pulling up a capacitive load comprising:

a driver transistor having a base, an emitter and a collector, the collector of which is connected to a predetermined voltage and the emitter of which is connected to said capacitive load, a diode having an anode and a cathode, the anode of which is connected to the base of said driver transistor, a switching transistor having a base, an emitter and a collector, the collector of which is connected to said cathode, a first biasing resistor connected between said predetermined voltage and said cathode, for raising said cathode to said predetermined voltage when said switching transistor is turned off, a second biasing resistor connected between said predetermined voltage and said anode, said second biasing resistor providing forward bias current through said diode when a forward bias voltage is applied thereto, a holding resistor connected between said predetermined voltage and the emitter of said driver transistor, said holding resistor providing current to said capacitive load in its pulled up state, means for applying an input voltage between the base and emitter of said switching transistor, said input voltage having a first value for turning on said switching transistor and developing a forward diode voltage between said anode and said cathode to thereby cause forward bias current to flow through said diode from said second biasing resistor, and build up a diode diffusion capacitance between said anode and said cathode, said input voltage having a second value for turning off said switching transistor and cutting off said current, to thereby raise said cathode to said predetermined voltage by virtue of the connection of said first biasing resistor, and raise the base of said driver transistor above said predetermined voltage by an amount equal to said forward diode voltage, whereby the emitter of said driver transistor, and said capacitive load connected thereto, are pulled up to a voltage, which differs from said predetermined voltage by less than the base-emitter voltage drop of said driver transistor.

5. The driver of claims 1, 2, 3 or 4 wherein said predetermined voltage is the driver power supply voltage.

6. The driver of claims 1, 2, 3 or 4 wherein said diode is the base-collector junction of a first transistor, the base of said first transistor being said anode and the collector of said first transistor being said cathode, said base-collector junction having a diffusion capacitance proportional to the forward bias current therethrough.

7. The driver of claim 2 further including means, responsive to said first input signal, for pulling down said capacitive load to below a second predetermined value.

8. The driver of claim 3 further including a pull-down transistor having a base, an emitter and a collector, the collector of which is connected to the emitter of said driver transistor, for pulling down the voltage of said capacitive load to below a second predetermined value in response to said first input signal.

9. The driver of claim 4 further including a pull-down transistor having a base, an emitter and a collector, the collector of which is connected to the emitter of said driver transistor, the base of which is connected to the base of said switching transistor and the emitter of which is connected to the emitter of said switching transistor, said pull-down transistor being responsive to the first value of said input voltage by conducting, and pulling the capacitive line down to a value given by the collector-emitter voltage of said pull-down transistor, and further being responsive to the second value of said input voltage by cutting off, to permit the capacitive load connected to the collector of said pull down transistor to be pulled up by said driver transistor.

10. The driver of claims 1, 2 or 3 further including a holding resistor connected between said predetermined voltage and the emitter of said driver transistor, for maintaining said capacitive load at the pulled-up level.

11. The driver of claims 2 or 3 wherein said first and second input signals are derived from the output of a digital circuit.

12. The driver of claim 11 wherein said digital circuit is a logic circuit.

13. The driver of claim 11 wherein said digital circuit is a clock circuit.

14. The drive of claim 4 wherein said input voltage supplying means is a digital circuit, the output voltage of which is applied between the base and emitter of said switching transistor.

15. The driver of claim 14 wherein said digital circuit is a digital logic circuit.

16. The driver of claim 3 wherein the emitter of said switching transistor is grounded, and wherein said first and second input signals are applied to the base of said switching transistor.

17. The driver of claim 4 wherein the emitter of said switching transistor is grounded, and wherein said input voltage is applied between the base of said switching transistor and ground.

* * * * *